United States Patent
Gunasekaran et al.

(10) Patent No.: US 11,519,954 B2
(45) Date of Patent: Dec. 6, 2022

(54) APPARATUS AND METHOD TO ACHIEVE FAST-FAULT DETECTION ON POWER SEMICONDUCTOR DEVICES

(71) Applicant: Analog Devices International Unlimited Company, Limerick (IE)

(72) Inventors: Deepak Gunasekaran, Longmont, CO (US); Michael John Collins, Firestone, CO (US); Kenneth G. Richardson, Erie, CO (US); Art Zirger, Boulder, CO (US); Steven Tanghe, Essex Junction, VT (US); Brian Jadus, Williston, VT (US)

(73) Assignee: Analog Devices International Unlimited Company, Limerick (IE)

( * ) Notice: Subject to any disclaimer, the term of this patent is extended or adjusted under 35 U.S.C. 154(b) by 175 days.

(21) Appl. No.: 16/935,115

(22) Filed: Jul. 21, 2020

(65) Prior Publication Data

US 2021/0063468 A1    Mar. 4, 2021

Related U.S. Application Data

(60) Provisional application No. 62/892,489, filed on Aug. 27, 2019.

(51) Int. Cl.
*G01R 31/26* (2020.01)
*H03K 5/24* (2006.01)
*H03K 17/687* (2006.01)

(52) U.S. Cl.
CPC .......... *G01R 31/2621* (2013.01); *H03K 5/24* (2013.01); *H03K 17/687* (2013.01)

(58) Field of Classification Search
CPC .. G01R 31/2621; G01R 31/3277; H03K 5/24; H03K 17/687
See application file for complete search history.

(56) References Cited

U.S. PATENT DOCUMENTS 6,108,182 A    8/2000    Pullen
6,144,245 A    11/2000    Balogh
(Continued)

FOREIGN PATENT DOCUMENTS

CN    203932987 U    11/2014
CN    105991010 A    10/2016
(Continued)

OTHER PUBLICATIONS

[No Author Listed], High Voltage, Isolated IGBT Gate Driver with Isolated Flyback Controller. AduM4138 Data Sheet. Analog Devices. Rev. A. 2018; 24 pages.

(Continued)

*Primary Examiner* — Dominic E Hawkins
(74) *Attorney, Agent, or Firm* — Wolf, Greenfield & Sacks, P.C.

(57) ABSTRACT

An apparatus and methods to operate the same to provide fast fault-detection on power semiconductor devices such as power transistors are disclosed. In some embodiment, a desaturation based fault-detection circuit for a power transistor is provided. The fault-detection circuit has an adaptable blanking time and a disconnect switch in the blanking mechanism that allow for quick enabling of fault-detection mechanisms to achieve fast fault detection times on power semiconductor devices.

20 Claims, 6 Drawing Sheets

(56) References Cited

U.S. PATENT DOCUMENTS

| | | | |
|---|---|---|---|
| 6,160,693 | A | 12/2000 | Sairanen |
| 6,208,185 | B1 | 3/2001 | John et al. |
| 6,717,785 | B2 | 4/2004 | Fukuda et al. |
| 6,906,574 | B2 | 6/2005 | Ohi et al. |
| 7,463,079 | B2 | 12/2008 | De et al. |
| 9,431,386 | B2 | 8/2016 | Zhang et al. |
| 10,038,434 | B2 | 7/2018 | Volke et al. |
| 10,038,436 | B2 | 7/2018 | Zhang et al. |
| 10,222,422 | B2 | 3/2019 | Zhang et al. |
| 10,298,223 | B2 | 5/2019 | Hokazono et al. |
| 10,473,710 | B2 | 11/2019 | Sullivan |
| 2003/0180997 | A1 | 9/2003 | Nakayama et al. |
| 2008/0212247 | A1* | 9/2008 | Lee .................. H03K 17/08128 361/88 |
| 2013/0154711 | A1* | 6/2013 | Kuttenkuler ..... H03K 17/08128 327/326 |
| 2014/0192449 | A1 | 7/2014 | Shimizu |
| 2018/0115310 | A1* | 4/2018 | Horiguchi ............ H03K 17/166 |
| 2019/0123546 | A1 | 4/2019 | Wang et al. |
| 2020/0021284 | A1* | 1/2020 | Thalheim ................ H03K 5/24 |

FOREIGN PATENT DOCUMENTS

| | | |
|---|---|---|
| CN | 208782462 U | 4/2019 |
| DE | 112013006487 T5 | 10/2015 |
| JP | 3949640 B2 | 7/2007 |
| WO | WO 2018/087374 A1 | 5/2018 |

OTHER PUBLICATIONS

Chen et al., An Improved IGBT Short-Circuit Protection Method with Self-Adaptive Blanking Circuit Based on $V_{CE}$ Measurement. IEEE. 2017; 11 pages.

Wang et al., Design and Performance Evaluation of Overcurrent Protection Schemes for Silicon Carbide (SiC) Power MOSFETs. IEEE Transactions on Industrial Electronics. Oct. 2014; 61(10): 5570-5581.

Zhang et al., A Self-Adaptive Blanking Circuit for IGBT Short-Circuit Protection Based on $V_{CE}$ Measurement. IEEE. 2015; 4125-4131.

Chokhawala et al., A Discussion on IGBT Short-circuit Behavior and Fault Protection Schemes. IEEE, Transactions on Industry Applications. Mar.-Apr. 1995. vol. 31, No. 2, pp. 256-263. 8 pages.

\* cited by examiner

APPARATUS AND METHOD TO ACHIEVE FAST-FAULT DETECTION ON POWER SEMICONDUCTOR DEVICES

CROSS-REFERENCE TO RELATED APPLICATIONS

This application claims the benefit under 35 U.S.C. § 119(e) of U.S. Patent Application Ser. No. 62/892,489, filed Aug. 27, 2019, and entitled "GATE VOLTAGE SENSE-BASED BLANKING FOR A DE-SATURATION BASED FAULT DETECTION TECHNIQUE," which is hereby incorporated by reference herein in its entirety.

FIELD OF THE DISCLOSURE

The present disclosure relates to fault detection of power transistors.

BACKGROUND

A gate driver circuit is sometimes used for controlling a power semiconductor device, which may also be referred to as a power device, power transistor, or a power switch. Examples of a power transistor include a power metal-oxide-semiconductor field-effect transistor (MOSFET) or an insulated-gate bipolar transistor (IGBT).

During operation, the power transistor may be turned on in response to a gate voltage applied by the gate driver circuit at a gate terminal of the power transistor. In the on state, the power transistor has a low-resistance between a collector terminal (or source terminal) and a emitter terminal (or drain terminal), and a current may flow through the power transistor. Whereas in the off state, the power transistor has a high resistance and little to no current can flow through the power transistor.

Power transistors are used to switch on and off a current supplied to a load such as an industrial motor drive. A fault such as a short circuit condition in the load will cause a spike in the current level that can exceed the current handling capability of the power transistor, causing potentially catastrophic failure of the power transistor.

Fault conditions of a power semiconductor device are sometimes detected using desaturation-based (or saturation-based) fault detection, in which the collector-to-emitter voltage $V_{CE}$ (or drain-source voltage $V_{DS}$) of the power transistor is sensed and compared against a set reference to determine if the device has entered a fault mode. When a power transistor is turned on, the $V_{CE}$ initially has a high voltage level during a period of time when the power transistor transitions from a high resistance state to a low resistance state. To ensure robust operation, the desaturation-based sensing mechanism needs to be blanked or disabled during the turn-on process of the power transistor to avoid reporting a false positive.

SUMMARY OF THE DISCLOSURE

An apparatus and methods to operate the same to provide fast fault-detection on power semiconductor devices such as power transistors are disclosed. In some embodiment, a desaturation based fault-detection circuit for a power transistor is provided. The fault-detection circuit has an adaptable blanking time and a disconnect switch in the blanking mechanism that allow for quick enabling of fault-detection mechanisms to achieve fast fault detection times on power semiconductor devices.

In some embodiment, a fault-detection circuit for a power transistor is provided. The fault-detection circuit comprises a sense input terminal configured to detect a collector-to-emitter voltage of the power transistor; a gate sense terminal configured to detect a gate voltage of the power transistor; a protection comparator having a comparator input and a comparator output; a switch coupled between the sense input terminal and the comparator input. The switch is controllable to be open when the power transistor transitions from an off state to an on state until the gate voltage crosses a pre-determined threshold. The fault-detection circuit is configured to generate an output signal at the comparator output indicative of a fault based on the measured collector-to-emitter voltage.

In some embodiments, a fault-detection circuit for a power transistor is provided. The fault-detection circuit comprises a protection comparator having a comparator input and a comparator output. The comparator input is configured to detect a collector-to-emitter voltage of the power transistor. The fault-detection circuit further comprises a gate sense terminal configured to measure a gate voltage of the power transistor; a switch coupled between the comparator output and a reference voltage. The switch is controlled to be closed when the power transistor transitions from an off state to an on state until the gate voltage crosses a pre-determined threshold. The fault-detection circuit is configured to generate an output signal at the comparator output indicative of a fault based on the measured collector-to-emitter voltage.

In some embodiments, a method for detecting fault condition for a power transistor is provided. The power transistor has a gate, a collector and an emitter. The method comprises turning on the power transistor from an off state; determining whether a gate voltage of the power transistor crosses a pre-determined threshold; in response to a determination that the gate voltage crosses the pre-determined threshold, coupling a sense input terminal to a voltage node that is connected to the collector by closing a switch coupled between the sense input terminal and the voltage node; determining whether a collector-to-emitter voltage of the power transistor at the sense input terminal crosses a pre-determined threshold; and in response to a determination that the measured collector-to-emitter voltage crosses the pre-determined threshold, determining a fault.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear. In the drawings.

DETAILED DESCRIPTION

Aspects of the present disclosure are directed to a desaturation-based fault-detection circuit that with an adaptable blanking time and a disconnect switch in the blanking mechanism that allow for quick enabling of fault-detection mechanisms to achieve fast fault detection times on power semiconductor devices.

According to an aspect of the present disclosure, the fault-detection circuit uses sensed gate voltage of the power transistor to influence the duration of the blanking interval, as opposed to the blanking duration being a fixed number that is set offline based on a conservative estimate. The gate voltage-based blanking duration can aid in adapting the blanking time to accommodate for different slew rates on the power transistor. Furthermore, the duration of blanking can automatically shorten when the power transistor turns-on into a fault. The shortening of blanking duration can lead to faster fault detection times, thereby limiting the peak fault current and increasing the reliability of the power transistor.

In some embodiments, the desaturation sensing mechanism detects the collector-to-emitter voltage from a sense input terminal connected to the power transistor. According to another aspect of the present disclosure, blanking is implemented by a switch that decouples the desaturation sensing mechanism from detecting the collector-to-emitter voltage during the blanking duration without grounding the sense input terminal. The inventors have recognized and appreciated that keeping the sense input terminal at a voltage greater than zero during the blanking duration can advantageously speed up the time for fault-detection upon completion of the blanking duration compared to blanking techniques that rely on grounding of the sense input terminal, because of the elimination of a capacitance charge-up time associated with the sense input terminal. In some embodiments, a switch serially connect a protection comparator with the sense input terminal, and is configured to be open during the blanking duration. In some other embodiments, an output of the protection comparator is switchably coupled to a reference voltage during the blanking period to disable the desaturation based sensing mechanism.

The aspects and embodiments described above, as well as additional aspects and embodiments, are described further below. These aspects and/or embodiments may be used individually, all together, or in any combination of two or more, as the disclosure is not limited in this respect.

Figure 1:
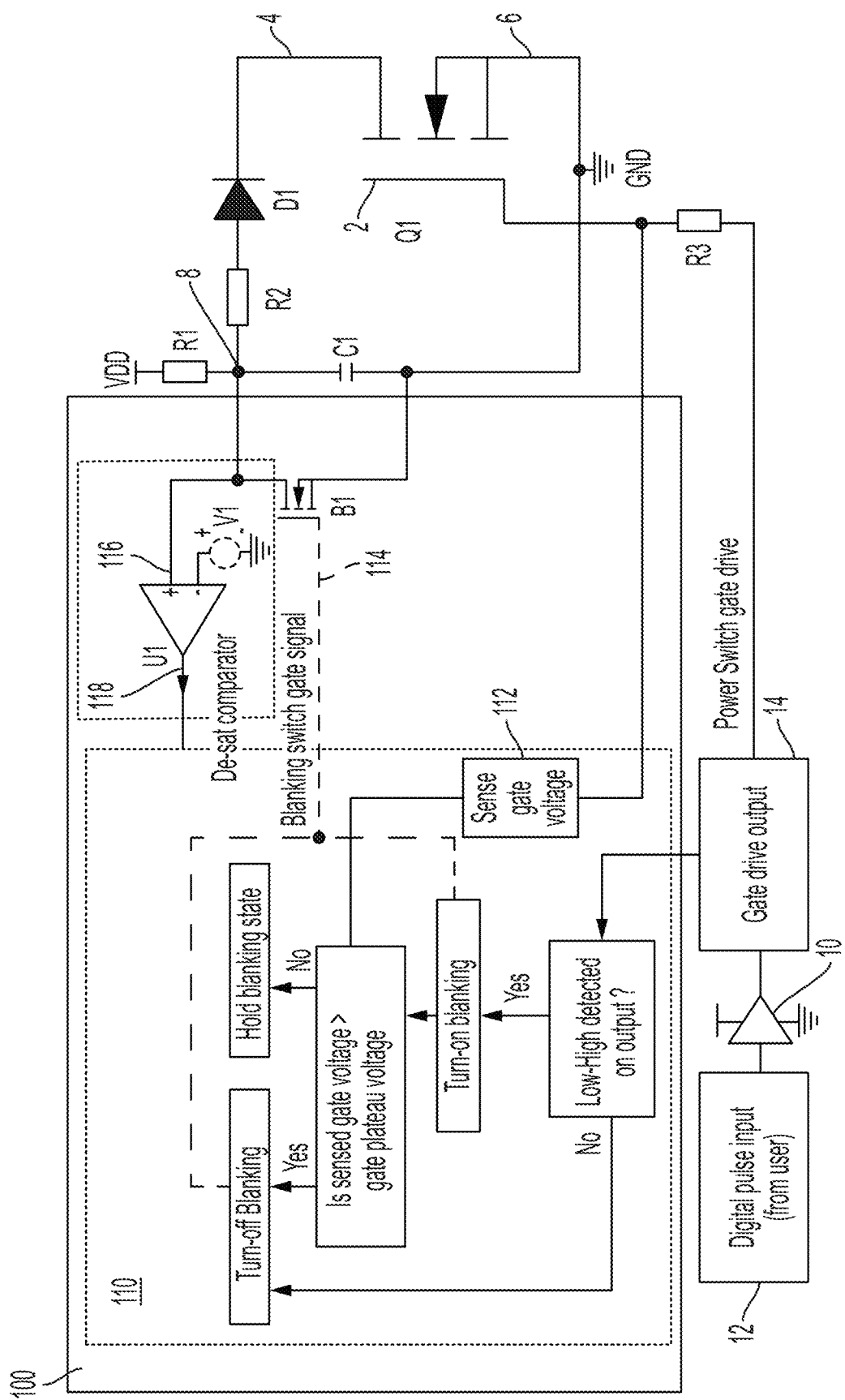
FIG. 1 is a high level schematic diagram illustrating a fault-detection circuit for a power transistor, in accordance with some embodiments.

FIG. 1 is a high level schematic diagram illustrating a fault-detection circuit 100 for a power transistor Q1, in accordance with some embodiments. Fault-detection circuit 100 has a logic 110, a protection comparator U1, a blanking switch B1. The power transistor Q1 has a gate 2, source 6, and drain 4. The power transistor Q1 is controlled by a gate drive 10 that receives input from a digital pulse input 12.

While Q1 is illustrated as a MOSFET, aspects of the disclosure are not so limited. For example, Q1 may be a IGBT and terminals 4 and 6 may be collector and emitter terminals. It is also not a limitation that Q1 have a particular polarity, and either P- or N-MOSFET may be used with embodiments of the fault-detection circuit described herein.

In FIG. 1, fault-detection circuit 100 monitors the gate voltage 112 of the power transistor Q1 to determine the duration of blanking for the protection comparator U1 by the blanking switch B1. When B1 is ON, for example controlled by a high gate signal 114 to B1, the comparator U1 is "blanked" or disabled as the comparator input 116 is pulled to ground via B1. When B1 is OFF, protection comparator U1 is enabled and can detect a fault by comparing a collector-to-emitter voltage of the power transistor Q1 at voltage node 8 using the comparator input 116. When the voltage at the comparator input 116 exceeds a the desaturation voltage threshold voltage V1, protection comparator U1 generates a high signal at the output terminal 118 indicating to logic 110 that a fault on the power transistor Q1 has been detected. Protection comparator U1 may also be referred to as a desaturation or saturation comparator, as it is configured to compare a voltage with a threshold based on the desaturation-based sensing mechanism. It should be appreciated that because voltage values can be negative or positive depending on how the polarities are defined, comparing a voltage with a threshold can be implemented in a number of suitable ways and not limited to requiring a voltage to exceed a threshold value. The comparison can be made when the voltage crosses the threshold value in either direction, when an amplitude or absolute value of the voltage crosses the threshold value in either direction.

For at least some applications, a reliable blanking mechanism must protect against false detection of faults when the power transistor Q1 is controlled by gate drive 10 to switch from an OFF state to an ON state. The block diagrams within logic 110 illustrate the logical steps involved in the blanking mechanism.

In an application scenario, the gate drive 10 generates a gate drive output signal 14 that turns high soon after a digital pulse input 12 is provided by a user, for example after a propagation delay time. Once the gate drive output 14 turns high, the gate signal 114 to the blanking switch B1 turns high as controlled by the logic 110. The high gate signal 114 blanks the protection comparator U1 from detecting a fault when the power transistor Q1 is turning on.

Figure 2:
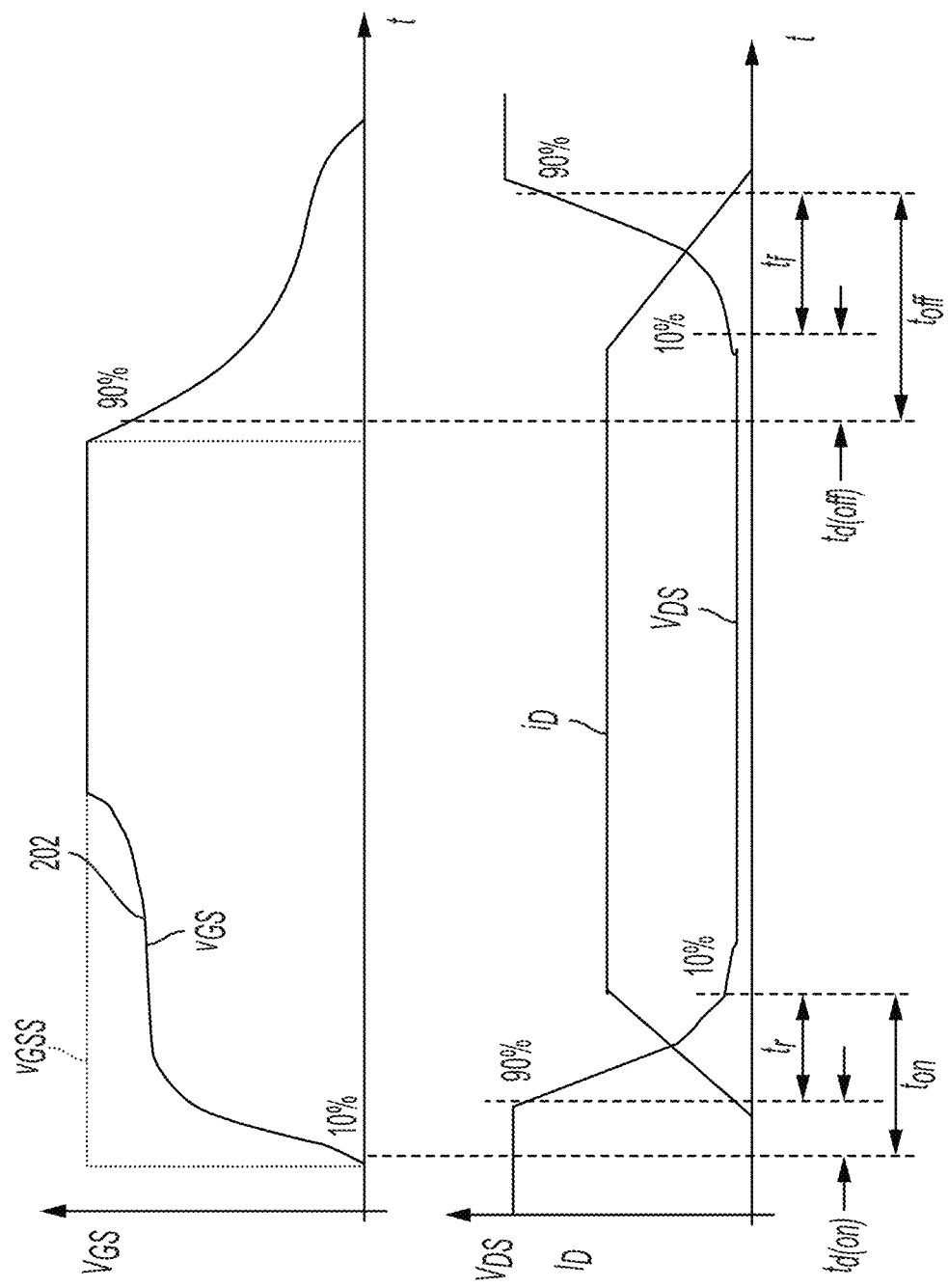
FIG. 2 is a schematic timing diagram of a gate-to-source voltage and a drain-to-source voltage of the power transistor as shown in FIG. 1 during a transition from OFF to ON state, in accordance with some embodiments.

FIG. 2 is a schematic timing diagram of a gate-to-source voltage and a drain-to-source voltage of the power transistor Q1 as shown in FIG. 1 during a transition from OFF to ON state, in accordance with some embodiments. In FIG. 2, gate voltage waveform $V_{GS}$ and drain-source—source terminals voltage waveform $V_DS$ are shown for a SiC MOSFET Q1 switching into/out of a resistive load. In FIG. 2, duration $t_r$ corresponds to the duration where $V_DS$ drops from 90% to 10% of the off-state voltage. $t_r$ represents the duration where the power switch (SiC MOSFET) is transitioning from OFF to ON. At the end of duration $t_r$ (or slightly after), the device is considered fully ON. For a robust fault detection circuit, blanking switch B1 in FIG. 1 should be ON throughout the duration $t_r$. In the absence of blanking during $t_r$, capacitor C1 can be charged to increase the voltage at voltage node 8 (diode D1 is blocking in $t_r$) either due to current from $V_{DD}$ or from noise coupled through the parasitic capacitance of diode D1. If the rise in the voltage of capacitor C1, and thus voltage at voltage node 8 exceeds the protection comparator reference voltage V1, protection comparator U1 could falsely indicate to logic 110 a fault has occurred, even though the sequence of events shown in FIG. 2 during $t_r$ is part of a normal power device turn-on event.

On the gate voltage waveform $V_{GS}$ in FIG. 2, duration $t_r$ corresponds to the duration of a characteristic gate plateau 202 for power transistor Q1. Once the power switch is fully ON, the gate voltage exits the plateau region and continues to rise to the ON-state gate output voltage applied by the gate drive output 14 as shown in FIG. 1. The inventors have recognized and appreciated that the end of a regular turn-on event on the power MOSFET coincides with the end of the gate plateau on the gate-source voltage waveform. In the embodiment shown in FIG. 1, the gate voltage 112 is sensed on a real-time basis and the blanking switch, B1 is turned-OFF once the gate voltage goes over the gate plateau 202. The voltage level of the gate plateau 202 can therefore be used as a pre-determined threshold to signal the termination of the blanking period and commencement of normal fault-detection. The required threshold (gate plateau voltage) for the gate voltage detection circuit can be obtained in a number of ways. For example, the gate plateau voltage can be obtained from the transfer characteristics of $V_{GS}$ vs $I_d$ from the power transistor datasheets, or from measurement of the power transistor. If the slew-rate on the drain-source of the power device changes, it would also reflect on the duration of the gate plateau. The gate voltage detection circuit would therefore adapt the blanking duration based on the change of slew rate.

Blanking during a turn-off event of the power device is less critical when compared to the turn-on event. A fault cannot occur on the power device when it is already OFF. Additionally, any fault occurring during the turn-off duration of the power device is also likely to be protected by normally turning-off the power device. Therefore, the sensed gate voltage 112 and portions of logic 110 that detects sensed gate voltage 112 for fault detection may be ignored once the gate drive output voltage 14 is set to low.

FIG. 2 illustrates drain and gate voltage transitions during regular switching events of a power transistor. However, when the transistor is turning ON into a fault such as in a hard switched fault condition, the drain-source voltage transition on the power transistor no longer reaches the typical on-state voltage drop of the power device.

Figure 3:
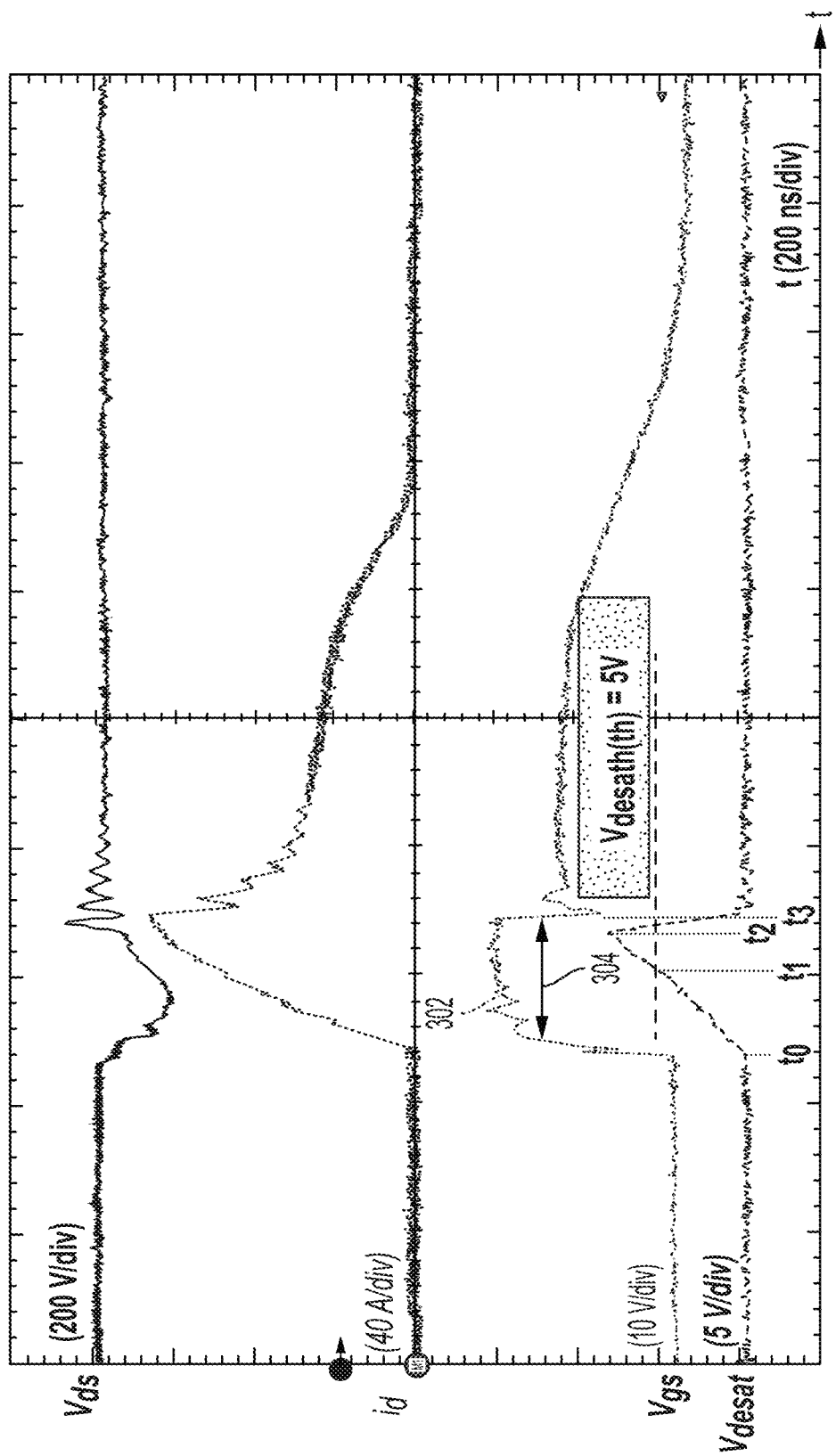
FIG. 3 is a data chart illustrating voltage versus time waveforms on a power transistor in an scenario when the power transistor turns on into a short-circuit fault.

FIG. 3 is a data chart illustrating voltage versus time waveforms on a power transistor in an scenario when the power transistor turns on into a short-circuit fault. At time to, the power transistor is turned on into a fault condition and the current $i_d$ starts to increase, while the detected source-drain voltage (or collector-to-emitter voltage) $V_{desat}$ also increases. At this point of time, the fault-detection circuit is blanked and is not responding to $V_{desat}$. While at $t_1$, $V_{desat}$ exceeds a pre-determined threshold value $V_{desat(th)}$, there is no response to the fault condition and current $i_d$ continues to rise.

Due to the reduced transition in the drain-source voltage in the fault mode, the effective capacitance seen at the gate terminal of the power transistor is lower than that in regular operation. As shown by the $V_{gs}$ trace in FIG. 3, at time $t_2$, the gate voltage $V_{gs}$ on the plateau reaches a gate plateau voltage 302. The time duration to reach the gate plateau 302, or the gate plateau region 304 between $t_2$ and to is expected to be shorter or non-existential compared to the corresponding duration to reach the gate plateau 202 in the regular operating mode shown in FIG. 2. Due to a shorter gate plateau region 304, the gate voltage magnitude can now reach the gate driver output voltage in a shorter time when compared to regular mode of operation. As a result, blanking is removed and the fault-detection circuit reacts to the $V_{desat}$ exceeding $V_{desat(th)}$ by turning off the power transistor at $t_3$. Since the reverse transfer capacitance of the power transistor is lower at higher drain-source voltages, it is quite possible to have no gate plateau in the gate-source in fault mode of operation and the time to turn off blanking and to detect fault condition can be further shortened.

Embodiments of the present disclosure relate the shorter gate plateau region 304 as shown in FIG. 3 in the scenario of a fault mode to the blanking mechanism in the fault-detection circuit 100 as shown in FIG. 1. As a result, the blanking duration can be much shorter when the power device switches ON into a fault. This is because the blanking mechanism senses the gate voltage and turns-off the blanking switch (B1 in FIG. 1) when the gate voltage is greater than the plateau voltage (set for normal operation mode). Since there is a much shorter or no gate plateau region in the fault mode, the blanking switch will be turned off much faster. So, the proposed blanking mechanism allows for a much faster blanking time during a fault mode. This allows for faster fault detection for desaturation-based fault detection.

Figure 4A:
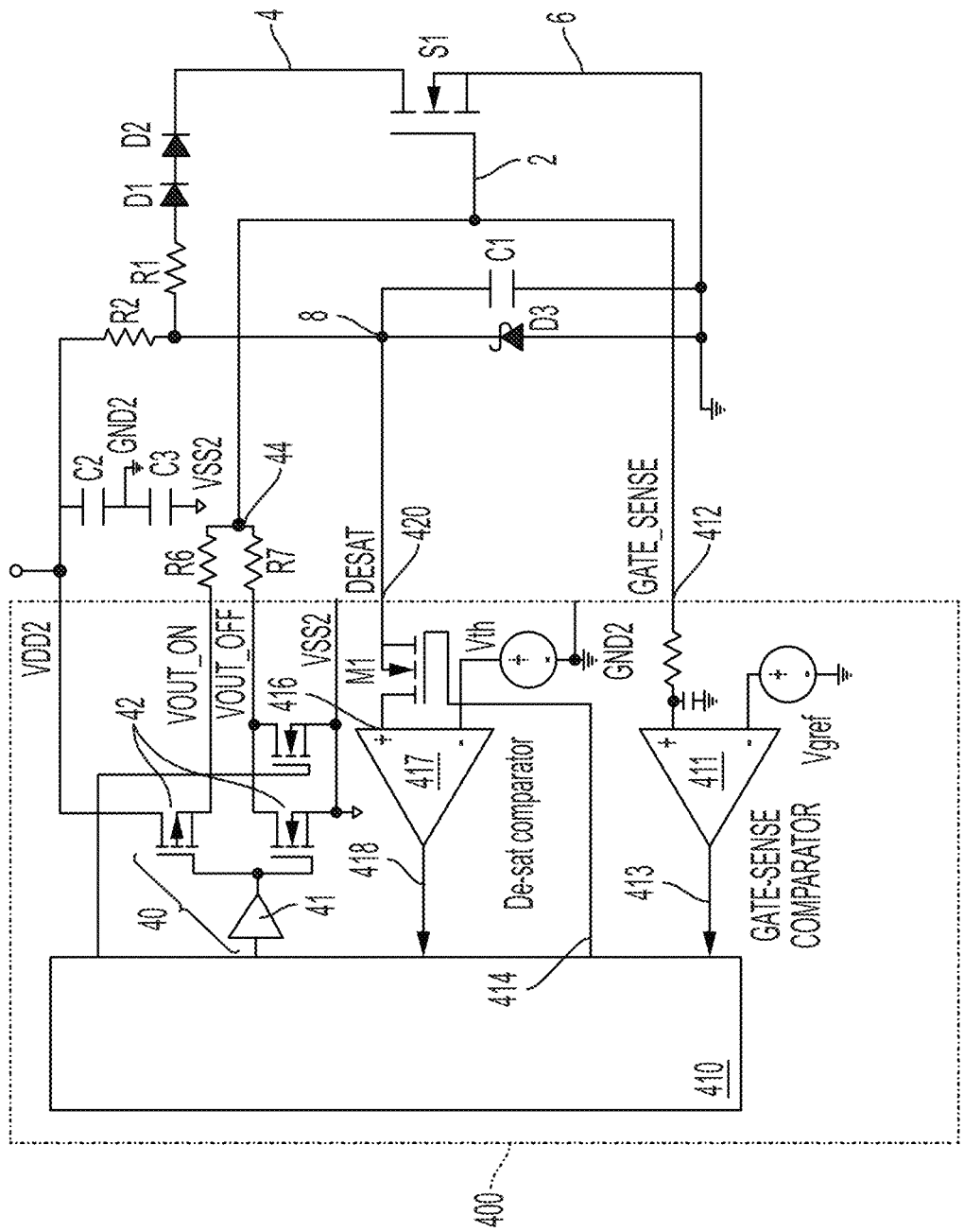
FIG. 4A is a high level schematic diagram illustrating a fault-detection circuit, in accordance with some embodiments.

FIG. 4A is a high level schematic diagram illustrating a fault-detection circuit 400, in accordance with some embodiments. Fault-detection circuit 400 has a control logic 410, a protection comparator 417, a switch M1, and a gate sense comparator 411. In FIG. 4A, fault-detection circuit 400 is for detection in a power transistor S1, which is similar to power transistor Q1 of FIG. 1 in some aspects, with like components represented by the same reference numbers.

In FIG. 4A, power transistor S1 is controlled by a gate drive control output signal at a gate drive output 44, which is generated by a gate drive 40. Gate drive 40 may have a buffer 41 that receives an input from control logic 410 and an inverter 42 that generates the gate drive control output signal at output 44 based on the input received by the buffer 41. A gate sense terminal 412 is coupled to gate terminal 2 to detect a gate voltage of power transistor S1. Gate sense comparator 411 compares the sensed gate voltage to a pre-determined threshold $V_{gref}$, and generates a gate sense signal 413 that indicates whether the gate voltage exceeds $V_{gref}$. $V_{gref}$ may be a pre-determined gate plateau voltage, such as but not limited to a Miller plateau voltage.

Still referring to FIG. 4A, a sense input terminal 420 is coupled to voltage node 8. The voltage on voltage node 8 is representative of a collector-to-emitter or a source-to-drain voltage of power transistor S1. Sense input terminal 420 is switchably coupled to a comparator input 416 of the protection comparator 417 by a switch M1.

The inventors have recognized and appreciated that while the embodiment in FIG. 1 uses a switch B1 to short the capacitor C1 during the blanking interval, it is advantageous to avoid shorting capacitor C1, or shorting the voltage node 8 on capacitor C1 to ground during blanking. In the event of a hard-switched fault, the capacitor C1 would have to charge from a low-voltage (close to 0) to over the threshold of the protection comparator (such as V1 in FIG. 1). The charging of capacitor C1 causes an additional delay in detecting a hard-switched fault and is undesirable in many applications, for example, in SiC related power transistor application. The embodiments illustrated in FIGS. 4A and 4B can alleviate the additional time delay related to charging C1 and can achieve a faster fault detection time compared to the embodiment described above in relation to FIG. 1.

While capacitor C1 is illustrated in FIG. 4A as a discrete component, it should be appreciated that capacitor C1 may represent an effective capacitance that includes parasitic capacitance within the circuit board on which power transistor S1 is disposed. It is also not a requirement that a discrete capacitor be provided across the source and drain terminals of the power transistor. In some applications, an external capacitor may be connected to the power transistor S1 as capacitor C1 to intentionally increase a charging delay time, for example to make the voltage measured at sense input terminal 420 less likely to be falsely-triggered due to spurious signals. In other applications, no external capacitor is provided, and C1 represents parasitic capacitance within the circuitry. Depending on applications, C1 may represent a combination of an external discrete capacitor and parasitic contributions, and aspects of the present disclosure are not so limited in this respect.

In FIG. 4A, a switch M1 is placed in series with the comparator input 416 of the protection comparator 417. The gate sense signal 413 at the output of the gate sense comparator 411 remains low as long as the gate voltage of the power transistor S1 is below the threshold voltage, $V_{gref}$. At this time, the control logic 410 generates a control signal 414 controlling the gate voltage of switch M1 that is also low. The switch M1 will be open during the blanking duration, which essentially disables the protection comparator 417 from responding to changes in voltage on voltage node 8, or otherwise voltage on the desaturation capacitor C1. The desaturation capacitor can now charge up all the way to $V_{DD2}$ as diodes D1 and D2 may be in blocking mode during the blanking duration.

Once the gate voltage rises above the gate threshold $V_{gref}$, Switch S1 is expected to be fully turned ON and the capacitor C1 would discharge through R1, D1, D2 and S1. In some embodiments, the discharge time constant is expected to be in the tens of ns range for a typical use case. The gate sense signal 413 at the output of the gate-sense comparator 411 also turns high in this duration. The control logic then turns the gate of the switch M1 high, enabling the protection comparator 417 to detect the voltage on capacitor C1. Since voltage across C1 is already charged prior to switch M1 being turned on, there is no additional delay in charging the capacitor C1 compared to blanking methods that grounds voltage node 8 on capacitor C1, such as the embodiment shown in FIG. 1. As a result, significant reduction in detect times for a hard-switched fault can be achieved, as the time taken to charge the capacitor C1 to the desired threshold once the blanking switch is released can run in to 100-500 ns depending on the RC time constants in the path charging C1.

In some embodiments, a fault detection circuit having the blanking mechanism as described herein may be a separate external component to the gate driver, or may be integrated as part of a gate driver integrated circuit (IC).

Figure 4B:
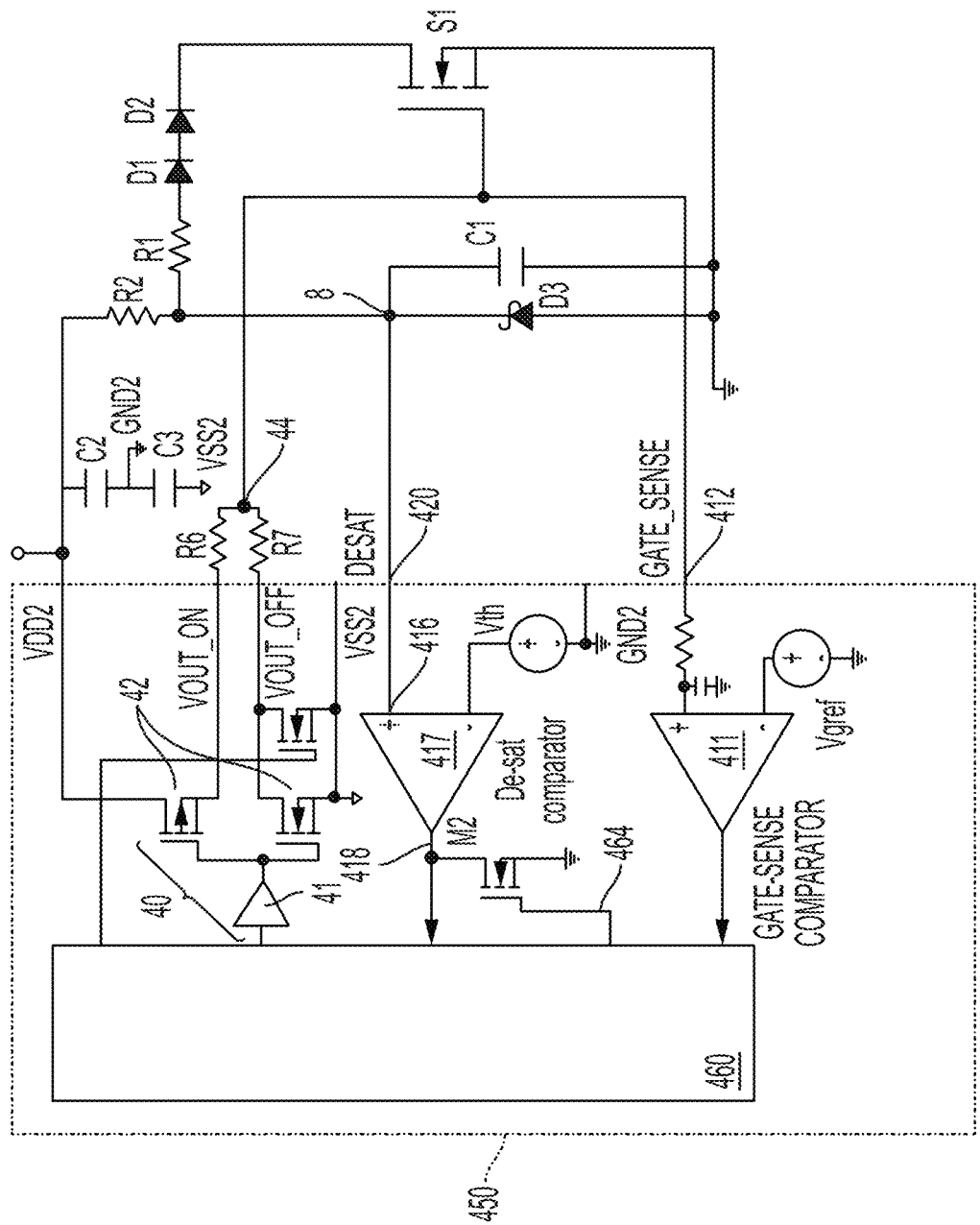
FIG. 4B is a high level schematic diagram illustrating another fault-detection circuit 450 that is a variation of the fault-detection circuit shown in FIG. 4A.

FIG. 4B is a high level schematic diagram illustrating another fault-detection circuit 450 that is a variation of the fault-detection circuit 400 shown in FIG. 4A. Fault-detection circuit 450 is similar to fault-detection circuit 400 of FIG. 4A in some aspects, with like components represented by the same reference numbers.

In FIG. 4B, a blanking switch M2 is placed at the comparator output 418 of the protection comparator, and is coupled between the comparator output 418 and a reference voltage such as ground. When the gate voltage is below the threshold $V_{gref}$ of the gate-sense comparator 411, the control logic 460 would control switch M2 to be turned-on. The turning on of switch M2 essentially disables the protection comparator 417 from responding to changes on the voltage of desaturation capacitor C1, since the comparator output 418 is fixed at a reference voltage regardless of whether protection comparator 417 reports a false-positive fault condition during the off-to-on transition of the power transistor S1. The desaturation capacitor C1 can therefore charge up all the way to $V_{DD2}$ during the blanking duration as diodes D1 and D2 may be in blocking mode during the blanking duration.

Still referring to FIG. 4B, once the gate voltage rises above the gate threshold $V_{gref}$, power transistor S1 is expected to be fully turned ON and the capacitor C1 would discharge through R1, D1, D2 and S1. The discharge time constant is expected to be in the 10 s of ns range for a typical use case. The output of the gate-sense comparator also turns high in this duration. The control logic 460 then turns the gate of the switch M2 low (turned-off), enabling the protection comparator to detect the voltage on capacitor C1.

Since voltage across C1 is already charged prior to switch M2 being turned off, there is no additional delay in charging the capacitor C1 compared to blanking methods that grounds voltage node 8 on capacitor C1, such as the embodiment shown in FIG. 1. As a result, significant reduction in detect times for a hard-switched fault can be achieved, as the time taken to charge the capacitor C1 to the desired threshold once the blanking switch is released can run in to 100-500 ns depending on the RC time constants in the path charging C1.

Figure 5:
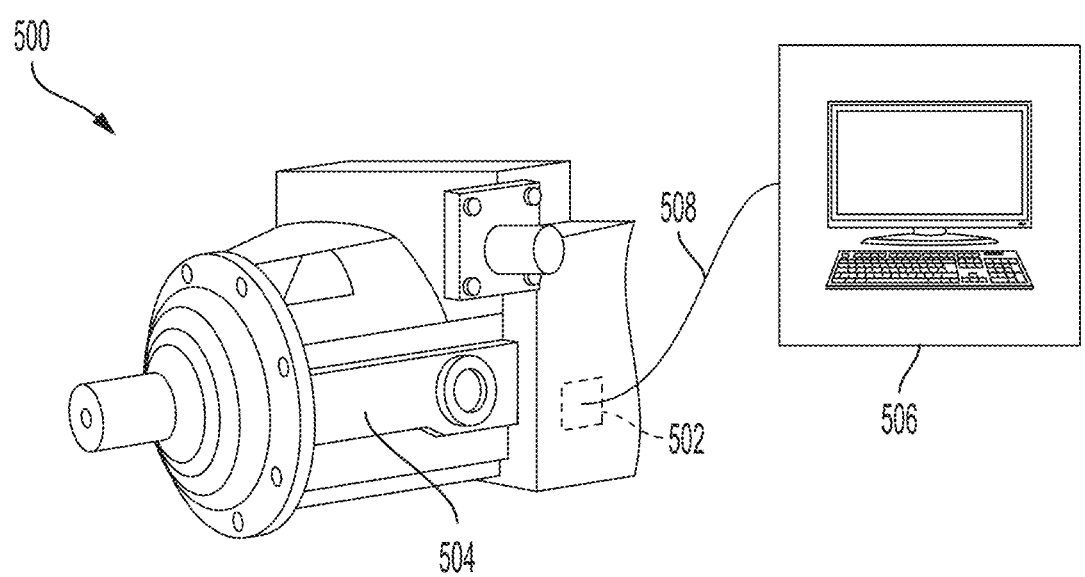
FIG. 5 is a schematic diagram showing an exemplary application of using a fault-detection circuit of the types described herein for power devices in an industrial apparatus.

FIG. 5 is a schematic diagram showing an exemplary application of using a fault-detection circuit of the types described herein for power devices in an industrial apparatus. In particular, system 500 includes power device 502, which may be controlled by a user input device 506 to provide a high current. In the example shown in FIG. 5, power device 502 drives industrial motor 504 based on control signals received from user input device 506 via cable 508. The user input device 506 may be a driver circuit, a processor, a personal computer (PC), a server, or another computing device. Although power device 502 is depicted as being integrated as part of industrial motor 504, power device 502 may be in practice arranged as a separate component connected to both industrial motor 504 and user input 506. Other such devices may also make use of the fault-detection circuits described herein.

Having thus described several aspects of at least one embodiment of this disclosure, it is to be appreciated that various alterations, modifications, and improvements will readily occur to those skilled in the art. Such alterations, modifications, and improvements are intended to be part of this disclosure, and are intended to be within the spirit and scope of the invention. Further, though advantages of the present disclosure are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present disclosure may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, aspects of the disclosure may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A fault-detection circuit for a power transistor, the fault-detection circuit comprising:
   a sense input terminal configured to detect a collector-to-emitter voltage of the power transistor;
   a gate sense terminal configured to detect a gate voltage of the power transistor;
   a protection comparator having a comparator input and a comparator output;
   a switch coupled between the sense input terminal and the comparator input, the switch controllable to be open when the power transistor transitions from an off state to an on state until the gate voltage crosses a pre-determined threshold, wherein
   the fault-detection circuit is configured to generate an output signal at the comparator output indicative of a fault based on the measured collector-to-emitter voltage.

2. The fault-detection circuit of claim 1, wherein the power transistor has a first terminal and a second terminal, and wherein the sense input terminal is configured to be coupled to a voltage node that is connected to the first terminal, the voltage node having a voltage relative to the second terminal, and wherein
   an amplitude of the voltage of the voltage node relative to the second terminal is larger than zero during a period when the switch is open.

3. The fault-detection circuit of claim 2, further comprising a capacitor coupled between the first terminal and the second terminal, and wherein the voltage is a voltage across the capacitor.

4. The fault-detection circuit of claim 1, wherein the pre-determined threshold is a gate plateau voltage during a transition of the power transistor from an off state to an on state.

5. The fault-detection circuit of claim 1, further comprising a gate sense comparator configured to compare the gate voltage with the pre-determined threshold, and to generate a gate sense signal indicating that the gate voltage crosses the pre-determined threshold.

6. The fault-detection circuit of claim 5, further comprising control logic configured to receive the gate sense signal, and to control the switch to open upon receiving the gate sense signal.

7. The fault-detection circuit of claim 1, wherein the protection comparator is configured to compare a voltage at the comparator input with a desaturation voltage threshold, and to generate the output signal when the voltage at the comparator input crosses the desaturation voltage threshold.

8. A fault-detection circuit for a power transistor, the fault-detection circuit comprising:
   a protection comparator having a comparator input and a comparator output, wherein the comparator input is configured to detect a collector-to-emitter voltage of the power transistor;
   a gate sense terminal configured to measure a gate voltage of the power transistor;
   a switch coupled between the comparator output and a reference voltage, the switch controlled to be closed when the power transistor transitions from an off state to an on state until the gate voltage crosses a pre-determined threshold, wherein
   the fault-detection circuit is configured to generate an output signal at the comparator output indicative of a fault based on the measured collector-to-emitter voltage.

9. The fault-detection circuit of claim 8, wherein the power transistor has a first terminal and a second terminal, and wherein the comparator input is configured to be coupled to a voltage node that is connected to the first terminal, the voltage node having a voltage relative to the second terminal, and wherein
   an amplitude of the voltage of the voltage node relative to the second terminal is larger than zero during a period when the switch is open.

10. The fault-detection circuit of claim 9, further comprising a capacitor coupled between the first terminal and the second terminal, and wherein the voltage is a voltage across the capacitor.

11. The fault-detection circuit of claim 8, wherein the pre-determined threshold is a gate plateau voltage during a transition of the power transistor from an off state to an on state.

12. The fault-detection circuit of claim 8, further comprising a gate sense comparator configured to compare the gate voltage with the pre-determined threshold, and to generate a gate sense signal indicating that the gate voltage crosses the pre-determined threshold.

13. The fault-detection circuit of claim 12, further comprising a control logic configured to receive the gate sense signal, and to control the switch to open upon receiving the gate sense signal.

14. The fault-detection circuit of claim 8, wherein the protection comparator is configured to compare a voltage at the comparator input with a desaturation voltage threshold, and to generate the output signal when the voltage at the comparator input crosses the desaturation voltage threshold.

15. A method for detecting fault condition for a power transistor having a gate, a first terminal and a second terminal, the method comprising:
   turning on the power transistor from an off state;
   determining whether a gate voltage of the power transistor crosses a pre-determined threshold;
   in response to a determination that the gate voltage crosses the pre-determined threshold, coupling a sense input terminal to a voltage node that is connected to the first terminal by closing a switch coupled between the sense input terminal and the voltage node;
   determining whether a collector-to-emitter voltage of the power transistor at the sense input terminal crosses a pre-determined threshold; and
   in response to a determination that the measured collector-to-emitter voltage crosses the pre-determined threshold, determining a fault.

16. The method of claim 15, further comprising:
   maintaining a voltage of the voltage node to be larger than zero during a period when the switch is open.

17. The method of claim 16, further comprising a capacitor coupled between the first terminal and the second terminal, and wherein the voltage is a voltage across the capacitor.

18. The method of claim 15, wherein the pre-determined threshold is a gate plateau voltage during a transition of the power transistor from an off state to an on state.

19. The method of claim 15, wherein turning on the power transistor comprises:

providing a gate drive output signal to the gate to turn on the power transistor.

20. The method of claim 19, further comprising:

opening the switch when the gate drive output signal is provided to the gate.

* * * * *